(12) United States Patent
Radice et al.

(10) Patent No.: US 7,042,304 B2
(45) Date of Patent: May 9, 2006

(54) CIRCUIT DEVICE FOR REALIZING A NON-LINEAR REACTIVE ELEMENTS SCALE NETWORK

(75) Inventors: Francesco Radice, Capiago Intimiano (IT); Melchiorre Bruccoleri, Rho (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 38 days.

(21) Appl. No.: 10/705,765

(22) Filed: Nov. 10, 2003

(65) Prior Publication Data

US 2004/0150456 A1 Aug. 5, 2004

(51) Int. Cl.
*H04B 3/00* (2006.01)
(52) U.S. Cl. .................... 333/19; 333/20; 301/106
(58) Field of Classification Search ............... 333/19, 333/20; 307/106
See application file for complete search history.

(56) References Cited

U.S. PATENT DOCUMENTS

| | | | | |
|---|---|---|---|---|
| 4,823,092 A | * | 4/1989 | Pennock | 330/253 |
| 4,839,542 A | * | 6/1989 | Robinson | 327/558 |
| 4,855,696 A | * | 8/1989 | Tan et al. | 333/20 |
| 5,332,937 A | * | 7/1994 | Castello et al. | 327/65 |
| 5,804,921 A | * | 9/1998 | McEwan et al. | 333/20 |
| 6,069,522 A | * | 5/2000 | Venkatraman et al. | 327/552 |
| 6,317,016 B1 | * | 11/2001 | Kuo | 333/215 |
| 6,335,655 B1 | * | 1/2002 | Yamamoto | 327/552 |
| 6,504,436 B1 | * | 1/2003 | Horikawa et al. | 331/11 |
| 6,580,326 B1 | * | 6/2003 | Bach et al. | 330/277 |
| 6,614,609 B1 | * | 9/2003 | Reed et al. | 360/51 |
| 6,690,243 B1 | * | 2/2004 | Henrion | 331/117 R |
| 6,697,001 B1 | * | 2/2004 | Oliaei et al. | 341/143 |
| 6,704,560 B1 | * | 3/2004 | Balteanu et al. | 455/333 |
| 6,784,698 B1 | * | 8/2004 | Brenden | 327/51 |
| 2002/0011895 A1 | | 1/2002 | Kuo | 327/552 |

FOREIGN PATENT DOCUMENTS

JP 404230588 * 8/1992

OTHER PUBLICATIONS

Bickley, D.T., "Design of Nonlinear Networks Using Gyrators," *Electronics Letters* 3 (11):519-521, Nov. 1967.

* cited by examiner

*Primary Examiner*—Robert Pascal
*Assistant Examiner*—Kimberly Glenn
(74) *Attorney, Agent, or Firm*—Lisa K. Jorgenson; Dennis M. de Guzman; Seed IP Law Group PLLC

(57) ABSTRACT

The invention relates to a circuit device for realizing a non-linear reactive elements scale network, wherein the non-linear elements of the network are pairs of inductive and capacitive components cascade connected between a pair of input terminals and a pair of output terminals. Advantageously in the invention, each component of the network is formed by cascade connecting a first and a second transconductance integrator with each other.

18 Claims, 3 Drawing Sheets

CIRCUIT DEVICE FOR REALIZING A NON-LINEAR REACTIVE ELEMENTS SCALE NETWORK

FIELD OF THE INVENTION

The present invention relates to a circuit device for realizing a non-linear reactive elements scale network.

BACKGROUND OF THE INVENTION

As it is well known in this technical field, for applications relating to non-linear decoding channels for digital transmission, electronic devices capable of implementing a scale network comprising LC non-linear elements would be needed. In fact, research carried out by the Applicant indicates that a non-linear channel would provide improved performance with respect to a standard transmission channel.

For example, the here-attached FIG. 1 schematically illustrates the structure of a scale network comprising n LC non-linear elements cascade connected together.

The network of FIG. 1 is essentially a quadrupole having a pair of input terminals to which a voltage potential Vo is applied, and having a pair of output terminals to which a resistive load Rt is connected.

All the pairs of LC non-linear elements, which is L1, C1; ..., Li, Ci, ..., Ln, Cn, have the same value. In other words, all the L components are identical with one another, as are the C components.

In particular, the non-linear equations that the network of FIG. 1 would be expected to implement are the following:

Equation (1)

$$C = \frac{C_0}{1 + \left(\frac{V_C}{V_0}\right)^2} \tag{1}$$

where, $C_0$ and $V_0$ are constants; and

Equation (2)

$$L = \frac{L_0}{1 + \left(\frac{I_L}{I_0}\right)^2} \tag{2}$$

where, $L_0$ and $I_0$ are constants.

FIG. 2 shows schematically a possible circuit embodiment based on the use of a derivator.

A bipolar transistor differential cell BJT receives a bias current I1 on a first circuit branch, and it is connected to ground by a current generator I. A potential equal to Vc lies across the emitter terminals of the transistor pair.

A transistor output stage, being supplied by a current Ic, is connected to said first circuit branch and has an output terminal connected to ground through the parallel of a capacitance and a current generator.

This embodiment is based on the following approximate equation:

Equation (3)

$$\left[1 + \left(\frac{V_C}{V_0}\right)^2\right]^{-1} \cong hyp\sec h^2\left(\frac{V_C}{V_0}\right) \tag{3}$$

The exponential voltage-current characteristic of the transistor pair BJT of the differential cell allows the desired non-linear equations to be synthesized where the substitution indicated in Equation (3) is carried into effect.

However, the dynamic performance of this hypothetical embodiment based on the use of a derivator would be inadequate to meet the requirements of the above application field.

If taking into consideration the non-linear capacitance alone, a possible embodiment of the network of FIG. 1 could be provided through the use of an integrator instead of a derivator. In this way, the superior dynamic characteristics of the integrator with respect to the derivator could be exploited.

An embodiment based on an integrator should implement the following operations:

Equation (4)

$$I_C = \frac{C_0}{1+\left(\frac{V_C}{V_0}\right)^2}\frac{\partial V_C}{\partial t} \Rightarrow \frac{1}{C_0}\int I_C\left[1+\left(\frac{V_C}{V_0}\right)^2\right]dt = V_C \tag{4}$$

from which it is evinced that two multipliers would be needed.

A circuit device realized according to Equation (3) would be highly complicated. Moreover this would be even worse since the scale network of FIG. 1 contains n LC pairs and, when the number n is greater than 10, as required in most applications, the complexity of the circuit embodiment would limit high-frequency performance.

SUMMARY OF THE INVENTION

The underlying technical approach to this invention is to provide a circuit device for realizing a non-linear reactive elements network, which device has suitable structural and functional features for the network to be implemented by minimizing complexity occupied area, and this without employing integrated inductors.

The principles of the present invention are based on implementing the scale network by using transconductance integrators that simulate non-linear inductors.

On the basis of the above idea, the technical problem is solved by a device as previously indicated and as defined in claim 1.

More particularly, in one embodiment the invention relates to a circuit device for realizing non-linear reactive elements scale network, wherein the non-linear elements in the network are pairs of inductive and capacitive components cascade connected between a pair of input terminals and a pair of output terminals.

The invention applies specifically to read-channel devices for hard disk drivers (HDDs), and broadly to digital communication systems, being part of a substitutive architecture of the so-called "partial-maximum likelihood response" (PRML) systems. This because it is considered that a "non-linear channel", based on the scale network as above, can provide stronger information decoding as for noise if compared to a standard scale (e.g., PRML, Peak Detection, etc.).

The features and advantages of the device according to the invention will become apparent from the following description of an embodiment thereof, given by way of non-limitative example with reference to the accompanying drawings.

DETAILED DESCRIPTION

Figure 1:
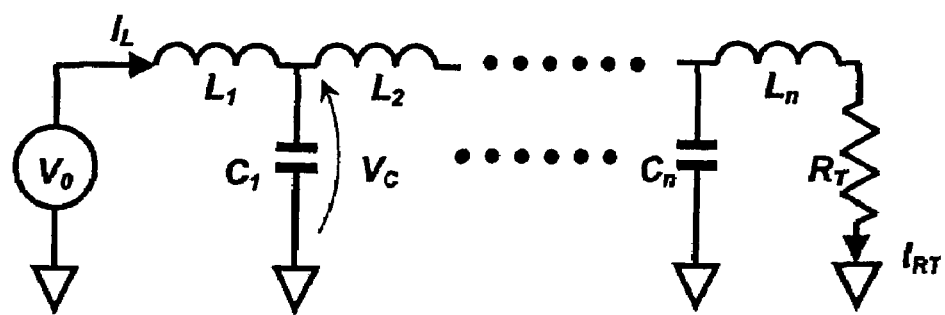
FIG. 1 shows schematically a scale network comprising n LC non-linear elements.
Figure 2:
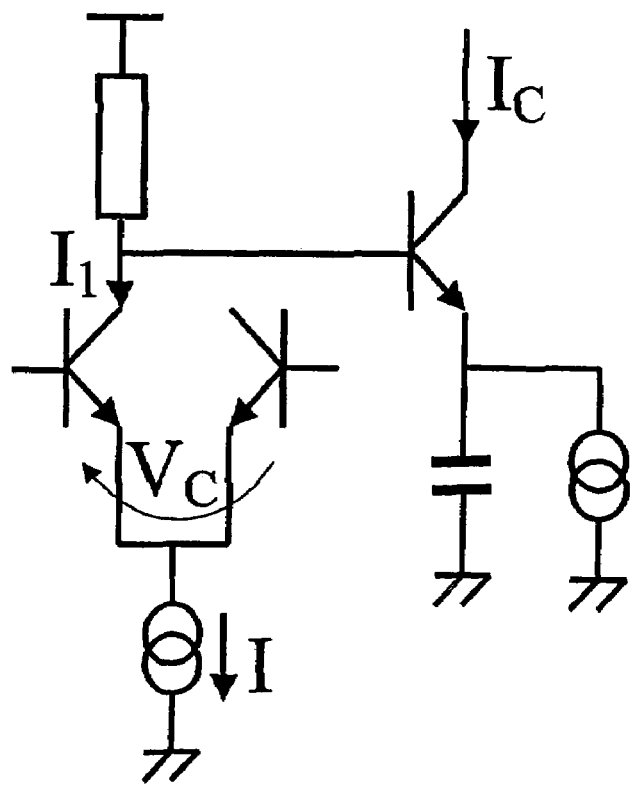
FIG. 2 shows schematically a conventional circuit based on a derivator for implementing the scale network of FIG. 1.
Figure 3:
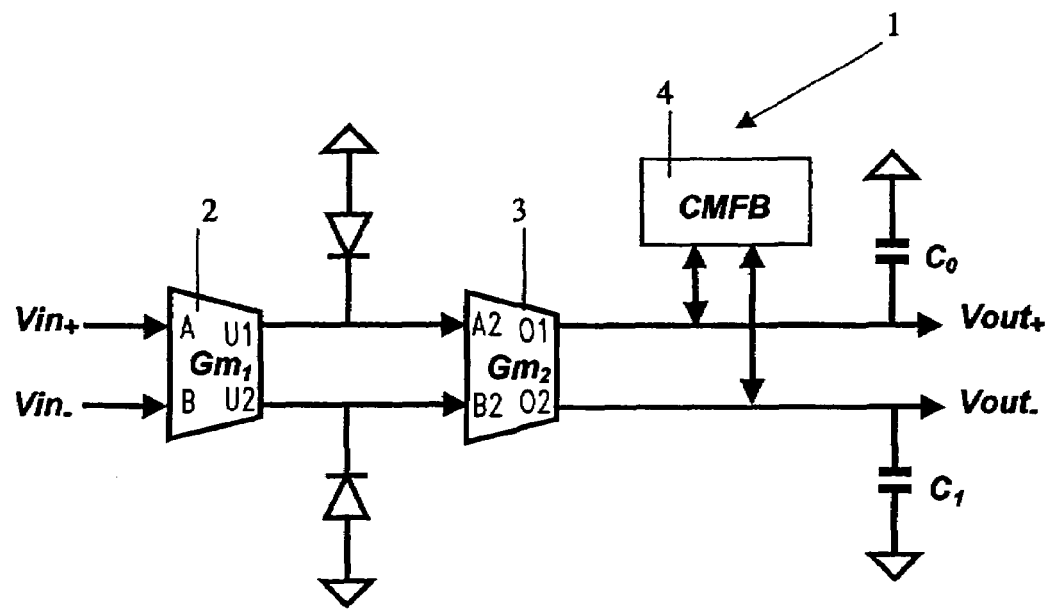
FIG. 3 shows schematically a circuit device according to this invention.
Figure 5:
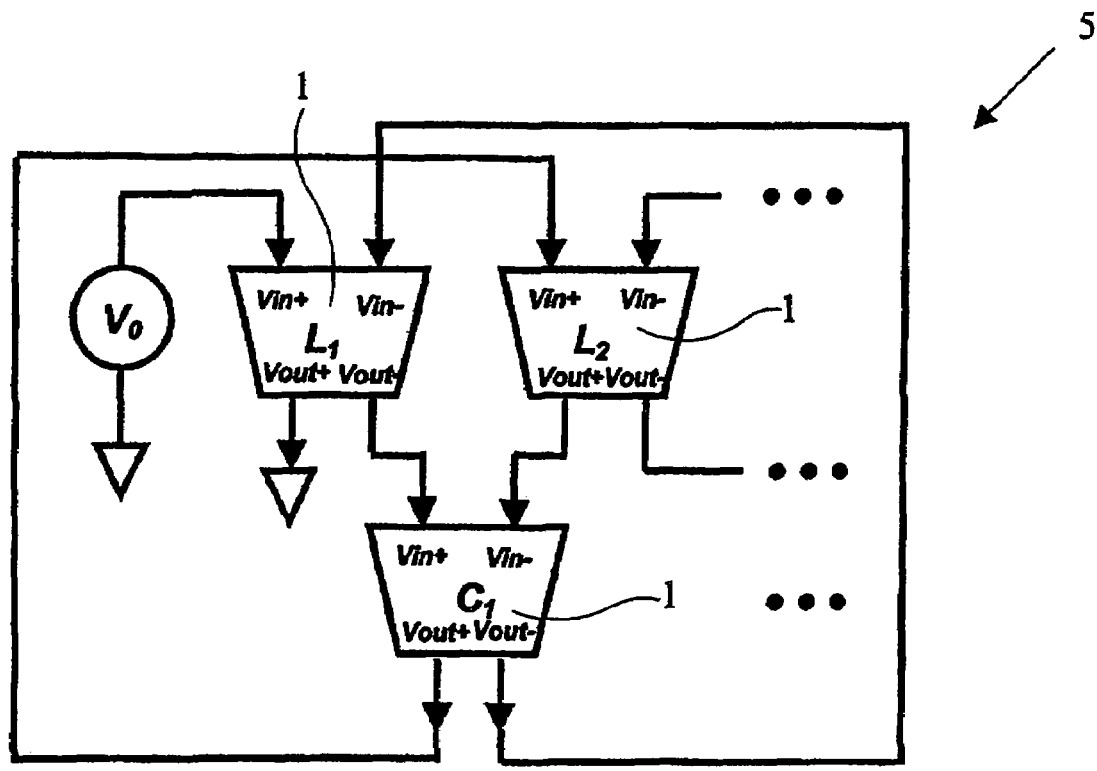
FIG. 5 shows schematically a portion of the scale network according to this invention realized by means of several devices of FIG. 3.
Figure 4:
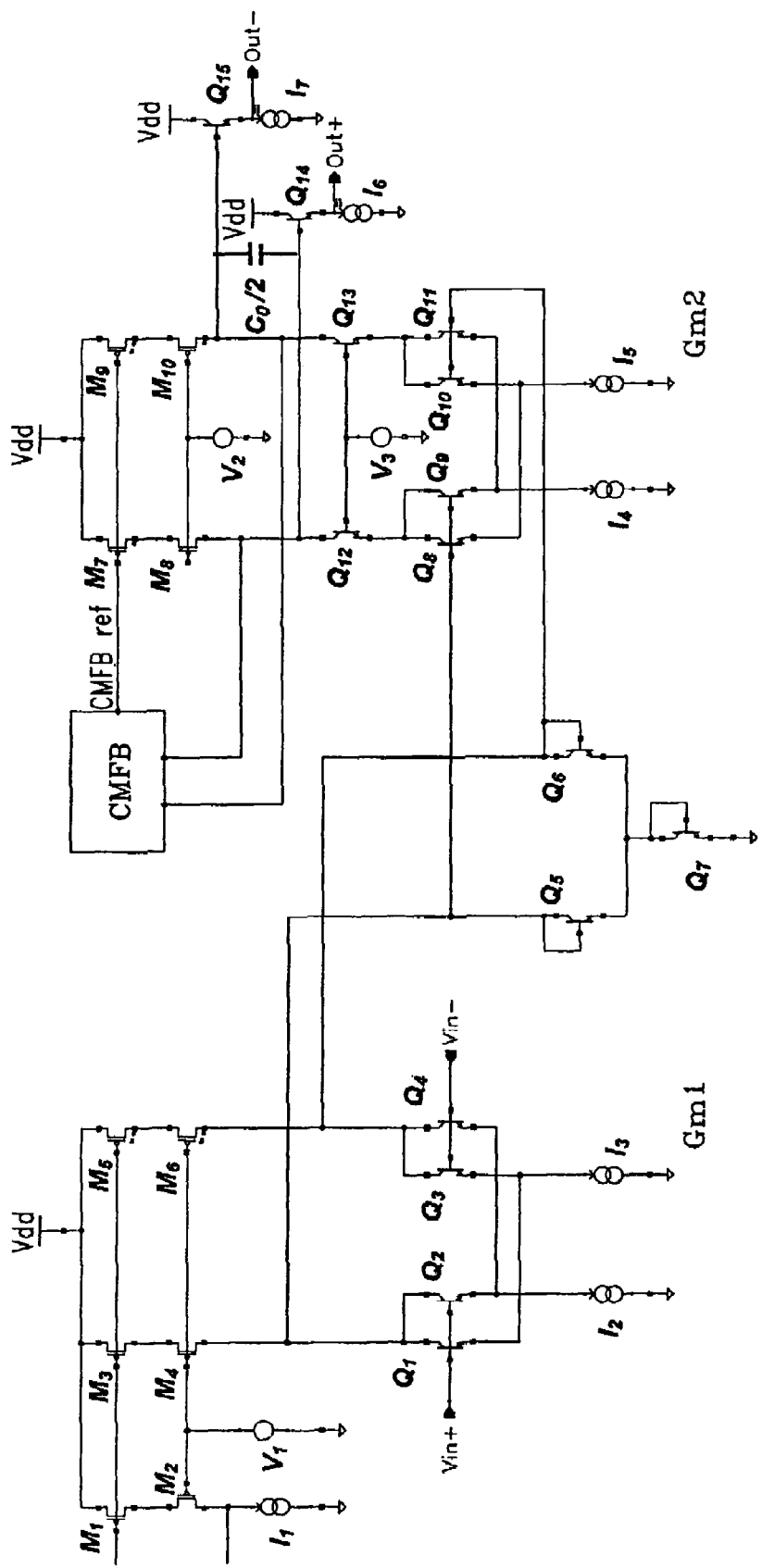
FIG. 4 is schematical view of the circuit detail of the device in FIG. 3.

With reference to the drawings, in particular to the embodiments illustrated by FIGS. 3, 4, and 5 schematically shown is a circuit according to the invention for implementing a network 5 of reactive LC non-linear elements, e.g., a network as shown schematically in FIG. 1.

The device 1 has a pair of input terminals A, B on which differential input voltages Vin+ and Vin−, are respectively applied.

The device 1 also has a pair of output terminals O1, O2 where differential output voltages Vout+ and Vout− are respectively produced.

The input terminals A, B are parts of a first transconductance (Gm1) integrator 2.

The differential output pair U1, U2 of this first integrator Gm1 are connected each to a respective differential input A2, B2 of a second transconductance (Gm2) integrator 3. These outputs O1 and O2 are coupled to a feedback CMFB (Common Mode FeedBack) block 4 arranged to provide a reference signal CMFB_ref for the bias circuit portion of the second integrator 3.

In a preferred embodiment, the transconductance Gm1 of the first integrator 2 has the same value as the transconductance Gm2 of the second integrator 3. The outputs U1, U2 are also coupled to ground through respective diodes Q5 and Q6, having their high impedance input coupled to the output lines. The second integrator 3 has differential outputs that are coincident with the outputs O1 and O2 of the device 1.

The outputs O1, O2 of the device 1 are further coupled to ground through respective stabilization capacitors $C_0$, $C_1$.

Briefly, the differential input voltage Vin+, Vin− corresponds to current Ic of Equation (4), and the differential output voltage Vout+, Vout− corresponds to voltage Vc of the same Equation (4).

The integrator pair 2 and 3 basically simulate the frequency performance of a capacitance C in the scale network of FIG. 1.

Also the non-linear inductor L may be implemented through an identical integrator pair design.

When implementing the inductor, L, the differential input voltage Vin+, Vin− corresponds to voltage V of the inductor, and the differential output voltage Vout+, Vout− corresponds to current $I_L$.

The device 1 of this invention has, therefore, no integrated inductors, so that the circuit complexity and overall occupied area of the device can be minimized.

FIG. 4 schematically shows in greater circuit detail the structure of device 1.

In one embodiment, both the first and the second integrators 2 and 3, respectively are formed with mixed bipolar-MOS technology by means of bipolar transistor differential cells biased by MOS circuit portions. Other circuit designs may be used.

The first integrator 2 comprises a differential cell having a double pair of transistors, Q1, Q2 and Q3, Q4, which is associated with the differential inputs A, and B.

A bias circuit portion, comprising MOS transistors M1, . . . , M6, is arranged to couple the differential cell with the supply voltage references Vdd and the bias voltage and current references I1 and V1.

The transistors Q5, Q6 and Q7, diode configured, couple the outputs U1, U2 of the first integrator 2 to ground.

The outputs U1, U2 of the integrator 2 are connected to the respective inputs A2, B2 of the second integrator 3, the latter showing a differential cell structure of bipolar transistors with a double pair of input transistors Q8, Q9 and Q10, Q11.

A bias circuit portion comprised of MOS transistors M7, M8, M9 and M10 couples the differential cell of integrator 3.

A feedback block 4 connects the outputs O1, O2 of the second integrator 3 to the bias circuit portion in order to provide a voltage reference CMFB_ref for the transistor pair M7, M9.

A capacitance with value Co/2 is inserted across the outputs O1 and O2.

As said before, the device 1 allows the performance of one of the non-linear components of the scale network of FIG. 1, both the capacitive component C and the inductive component L, to be emulated.

Thus, the scale network structure can be reconstructed by using a plurality of suitably interconnected devices 1.

Shown in FIG. 5 is an exemplary portion of a scale network realized by connecting several devices 1 together, which are similar to the device described hereinabove.

FIG. 5 shows a first device 1, emulating a first inductor L1, as being connected to the voltage generator Vo at the first differential input A.

The output O1 is connected to ground, and the output O2 is connected to the differential input A of a second device 1 emulating the capacitor C1.

The output O2 of the second device emulating C1, is connected to the differential input B of the first device emulating L1.

The output O1 of the second emulating C1, is connected to the differential input A of a third device 1 emulating a second inductor L2 in the scale network.

The output O1 of the third device emulating L2 is connected to the differential input B of the second device emulating C1, and so on.

In this way, a non-linear scale network can be implemented with at least twenty LC elements, without using integrated inductors.

The network implemented with a cascade of devices 1 according to the invention has shown to have excellent characteristics of frequency response.

In addition, the total circuit area occupied by the cascade of devices 1 is smaller than that required by conventional designs.

Lastly, the non-linear scale network of the invention allows a cascade connection of many more elements than in conventional designs.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A circuit for realizing a non-linear reactive elements scale network, comprising:
 a plurality of non-linear elements of the network acting as inductive and capacitive components cascade connected between a pair of input terminals and a pair of output terminals, each component of the network being formed by cascade connecting a first and a second transconductance integrator with each other, each integrator having a bipolar transistor input circuit portion and a MOS transistor bias circuit portion, and having at least one output of the second integrator feedback connected to the bias circuit portion of the same integrator through a feedback block.

2. The circuit according to claim 1 wherein said feedback block provides a voltage reference for said bias circuit portion.

3. The circuit according to claim 1 wherein the first and the second integrator have the same transconductance.

4. The circuit according to claim 1, wherein the plurality comprises at least twenty inductive and capacitive components.

5. A circuit for realizing a non-linear reactive elements scale network, the circuit comprising:
 a plurality of non-linear elements of the network acting as inductive and capacitive components cascade connected between a pair of input terminals and a pair of output terminals, each component of the network being formed by cascade connecting a first and a second transconductance integrator with each other, outputs of the first integrator being connected to inputs of the second integrator and being coupled to ground by respective diodes.

6. A circuit for realizing a non-linear reactive elements scale network, the circuit comprising:
 a plurality of non-linear elements of the network acting as inductive and capacitive components cascade connected between a pair of input terminals and a pair of output terminals, each component of the network being formed by cascade connecting a first and a second transconductance integrator with each other, outputs of the first integrator being connected to inputs of the second integrator and being coupled to ground by respective diodes; and
 differential outputs respectively coupled to ground through a stabilization capacitance.

7. A circuit for realizing a non-linear reactive elements scale network, comprising:
 a plurality of non-linear elements of the network acting as inductive and capacitive components cascade connected between a pair of input terminals and a pair of output terminals, each component of the network being formed by cascade connecting a first and a second transconductance integrator with each other, wherein each pair of integrators implements the following equation, in order to emulate a capacitor, or a similar equation with L indexes in order to emulate an inductor:

$$I_C = \frac{C_0}{1+\left(\frac{V_C}{V_0}\right)^2} \frac{\partial V_C}{\partial t} \Rightarrow \frac{1}{C_0}\int I_C\left[1+\left(\frac{V_C}{V_0}\right)^2\right]dt = V_C. \quad (4)$$

8. A circuit, comprising:
 a circuit input;
 a plurality of non-linear inductor simulation components, each having an input and an output, the input of the non-linear inductor simulation components being coupled to the circuit input;
 a plurality of non-linear capacitor simulation components, each having an input and an output;
 a coupling from an output of at least one of the non-linear inductor simulation components to the input of at least one of the non-linear capacitor simulation components;
 a coupling from an output of at least one of the non-linear capacitor simulation components to the input of at least one of the non-linear inductor simulation components; and
 a circuit output coupled to the output of the non-linear capacitor simulation components;
 at least one diode coupled between the output of at least one of the non-linear inductor simulation components and ground; and
 a common mode feedback circuit coupled to the circuit output.

9. The circuit according to claim 8, further including:
 a feedback circuit coupled to the circuit output in order to provide a reference signal level for the feedback.

10. The circuit according to claim 8 wherein the circuit input is a differential input.

11. The circuit according to claim 8 wherein at least one of the inductor simulation components includes bipolar transistors.

12. The circuit according to claim 8 wherein at least one of the inductor simulation components includes MOS transistors.

13. A circuit, comprising:
 a circuit input;
 a plurality of non-linear inductor simulation components, each having an input and an output, the input of the non-linear inductor simulation components being coupled to the circuit input;
 a plurality of non-linear capacitor simulation components, each having an input and an output;
 a coupling from an output of at least one of the non-linear inductor simulation components to the input of at least one of the non-linear capacitor simulation components;
 a coupling from an output of at least one of the non-linear capacitor simulation components to the input of at least one of the non-linear inductor simulation components; and
 a circuit output coupled to the output of the non-linear capacitor simulation components;
 at least one diode coupled between the output of at least one of the non-linear inductor simulation components and ground; and
 a disk drive read channel signal line coupled to the circuit input to provide data stored on a disk drive to the circuit.

14. A method of simulating a capacitive and inductor network, the method comprising:

receiving a differential input signal from a disk drive read channel at a simulated non-linear inductor circuit having bipolar transistors;

integrating the input signal to simulate a non-linear inductor and outputting the results;

receiving a differential input signal from the output of the non-linear inductor at a simulated non-linear capacitor circuit;

integrating the differential input signal to simulate a non-linear capacitor; and outputting the integrated capacitor signal as the output of the circuit.

15. The method according to claim 14, further including:

feeding back an output from the capacitor circuit to at least one input of the inductor simulation circuit.

16. A circuit for realizing a non-linear reactive elements scale network, the circuit comprising:

a plurality of non-linear elements of the network acting as inductive and capacitive components cascade connected between a pair of input terminals and a pair of output terminals, each component of the network being formed by cascade connecting a first and a second transconductance integrator with each other, each integrator having a transistor input circuit portion and a transistor bias circuit portion, and having at least one output of the second integrator feedback connected to the bias circuit portion of the same integrator through a feedback block, each of the components having differential inputs and differential outputs, with an output of the network being a differential output.

17. A circuit for realizing a non-linear reactive elements scale network for data of a disk drive output, the circuit comprising:

a differential signal line pair coupled to the output of a disk drive signal line pair;

a plurality of non-linear elements of the network, at least one of the elements having an input coupled to the disk drive signal line pair, the elements acting as inductive and capacitive components cascade connected between a pair of input terminals and a pair of output terminals, each component of the network being formed by cascade connecting a first and a second transconductance integrator with each other, outputs of the first integrator being connected to inputs of the second integrator and being coupled to ground by respective diodes, each of the components having differential inputs and differential outputs, with an output of the network being a differential output.

18. A circuit, comprising:

a differential circuit input;

a plurality of non-linear inductor simulation components, each having a differential input and a differential output, the input of the non-linear inductor simulation components being coupled to the circuit input;

a plurality of non-linear capacitor simulation components, each having a differential input and a differential output;

a coupling from an output of the non-linear inductor simulation components to an least one input of at least one of the non-linear capacitor simulation components;

a coupling from an output of at least one of the non-linear capacitor simulation components to an input of at least one of the non-linear inductor simulation components;

at least one diode coupled between the output of at least one of the non-linear inductor simulation components and ground; and a differential output pair of signal lines being provided at the output of a non-linear capacitor simulation component.

* * * * *

UNITED STATES PATENT AND TRADEMARK OFFICE
CERTIFICATE OF CORRECTION

PATENT NO. : 7,042,304 B2
APPLICATION NO. : 10/705765
DATED : May 9, 2006
INVENTOR(S) : Francesco Radice et al.

It is certified that error appears in the above-identified patent and that said Letters Patent is hereby corrected as shown below:

<u>Title Page</u>
Item --(30), Foreign Application Priority Data, November 28, 2002 (EP) 02425734.7--, should be added <u>Column 6</u>
Line 22, "and" should be deleted <u>Column 8</u>
Line 24, "...an least one input..." should read as --...at least one input...--

Signed and Sealed this

Tenth Day of April, 2007

JON W. DUDAS
*Director of the United States Patent and Trademark Office*